US008603580B2

(12) United States Patent
Liu (10) Patent No.: US 8,603,580 B2
(45) Date of Patent: Dec. 10, 2013

(54) HIGH STABILITY AND HIGH CAPACITY PRECURSOR VAPOR GENERATION FOR THIN FILM DEPOSITION

(75) Inventor: Benjamin Y. H. Liu, North Oaks, MN (US)

(73) Assignee: MSP Corporation, Shoreview, MN (US)

(*) Notice: Subject to any disclaimer, the term of this patent is extended or adjusted under 35 U.S.C. 154(b) by 974 days.

(21) Appl. No.: 11/605,204

(22) Filed: Nov. 28, 2006

(65) Prior Publication Data

US 2007/0120275 A1    May 31, 2007

Related U.S. Application Data

(60) Provisional application No. 60/740,029, filed on Nov. 28, 2005.

(51) Int. Cl.
  *C23C 16/00*    (2006.01)
  *F22B 23/00*    (2006.01)
  *B01D 47/00*    (2006.01)

(52) U.S. Cl.
  USPC ......... 427/248.1; 118/715; 118/726; 261/100

(58) Field of Classification Search
  None
  See application file for complete search history.

(56) References Cited

U.S. PATENT DOCUMENTS

| 4,441,027 A | 4/1984 | Richardson et al. ....... 261/119.1 |
| 4,704,988 A * | 11/1987 | Mellet ........................... 118/726 |
| 5,078,922 A | 1/1992 | Collins et al. ................. 261/139 |
| 5,231,968 A | 8/1993 | Siefkes ......................... 123/549 |
| 5,288,325 A | 2/1994 | Gomi ............................ 118/692 |
| 5,400,665 A * | 3/1995 | Zhu et al. .................... 73/863.12 |
| 5,707,415 A * | 1/1998 | Cain ................................. 65/379 |
| 5,711,816 A * | 1/1998 | Kirlin et al. .................... 118/726 |
| 6,579,372 B2 | 6/2003 | Park ............................... 118/715 |
| 6,789,789 B2 * | 9/2004 | Randive et al. ................ 261/133 |
| 6,829,044 B2 | 12/2004 | Liu ................................. 356/37 |
| 2001/0035127 A1 * | 11/2001 | Metzner et al. ................ 118/715 |
| 2002/0078894 A1 * | 6/2002 | Timmons et al. .............. 118/726 |
| 2003/0064154 A1 * | 4/2003 | Laxman et al. ........... 427/255.28 |
| 2005/0006799 A1 | 1/2005 | Gregg et al. .................. 250/577 |
| 2005/0066893 A1 * | 3/2005 | Soininen ....................... 118/715 |
| 2006/0154480 A1 * | 7/2006 | Yamoto .......................... 438/680 |

FOREIGN PATENT DOCUMENTS

WO    WO2005/067017    *    7/2005

OTHER PUBLICATIONS

Dennis M. Hausmann, Esther Kim, Jill Becker, and Roy G. Gordon "Atomic Layer Deposition of Hafnium and Zirconium Oxides Using Metal Amide Precursors" Chem. Mater. 14: 4350-4358, 2002.

(Continued)

*Primary Examiner* — Joseph Miller, Jr.
(74) *Attorney, Agent, or Firm* — Westman, Champlin & Koehler, P.A.; Z. Peter Sawicki (57) ABSTRACT

A method for vaporizing a liquid for subsequent thin film deposition on a substrate. The method comprises vaporizing a liquid which is disposed within a tubular porous metal body. The porous metal body comprises a first surface defining a first carrier gas flow path and a second surface defining a second carrier gas flow path in a substantially opposite direct to the first carrier flow path. Vapor is generated from the liquid and added to a carrier gas that passes sequentially in direct contact along the first and second surfaces of the porous metal body to form a gas/vapor mixture with the carrier gas first flowing along the first surface and then along the second surface thereby providing a gas/vapor mixture for thin film deposition.

14 Claims, 8 Drawing Sheets

(56) References Cited

OTHER PUBLICATIONS

Jill S. Becker and Roy G. Gordon "Diffusion barrier properties of tungsten nitride films grown by atomic layer deposition from bis(tert-butylimido)bis(dimethylamido)tungsten and ammonia" Applied Physics Letters: 82 (14) Apr. 7, 2003.

Dennis M. Hausmann, Roy G. Gordon "Surface morphology and crystallinity control in the atomic layer deposition (ALD) of hafnium and zirconium oxide thin films", Journal of Crystal Growth 249: 251-261, 2003.

* cited by examiner

HIGH STABILITY AND HIGH CAPACITY PRECURSOR VAPOR GENERATION FOR THIN FILM DEPOSITION

CROSS-REFERENCE TO RELATED APPLICATION

The present application is based on and claims the benefit of U.S. provisional patent application Ser. No. 60/740,029, filed Nov. 28, 2006, the content of which is hereby incorporated by reference in its entirety.

BACKGROUND OF THE INVENTION

This invention relates to methods and apparatus for liquid precursor vaporization for thin film deposition and semiconductor device fabrication. The precursor liquid is vaporized in a precise and controlled manner to generate a high purity gas/vapor mixture that is substantially free of particulate contaminants. The gas/vapor mixture is then introduced into a chamber for film deposition and semiconductor device fabrication.

Thin film formation by chemical vapor deposition (CVD) is a well-known process in semiconductor device fabrication. In conventional CVD, a precursor vapor is introduced into a chamber in which one or more semiconductor wafers are held at a suitable temperature and pressure to form a thin film on the wafer surface. Insulating, conducting and semi-conducting thin films can be formed by the CVD process using suitable precursor chemicals. If the precursor is a liquid at room temperature, the liquid must be vaporized to form a vapor for film deposition. The process is often referred to as metal organic CVD, or MOCVD, if the precursor liquid is a metal organic compound. Apparatus for liquid precursor vaporization plays an important role in CVD and MOCVD applications. It must be designed properly and be capable of generating vapor with repeatability and accuracy to achieve uniform, high quality thin films for commercial device fabrication in semiconductor and related industries.

When the desired film thickness is small and approaches a few nanometers in overall thickness, an Atomic Layer Deposition (ALD) process can be used. In ALD two complementary vapor pairs are used. One, such as ammonia, is first chemisorbed onto the wafer surface to form a monolayer of molecules of the first vapor. A second vapor is then introduced into the chamber to react with the first chemisorbed vapor layer to form a single monolayer of the desired film. The process is repeated as many times as is necessary in order to form multiple atomic film layers with the desired overall thickness. The ALD process produces film with good step coverage and excellent conformity to the topography and underlying surface structure on the wafer. The film thickness can also be precisely controlled. For these reasons, ALD is finding increasing use in advanced semiconductor device fabrication involving small geometrical dimensions.

Vapor generation in a controlled manner is possible by direct liquid injection. Direct liquid injection is accomplished through a direct liquid vaporizer (DLI vaporizer), in which liquid is injected into a heated chamber for vaporization. The method is generally limited to vapor generation at rates that are higher than a few milligrams per second. When the desired vapor generation rate is low, it becomes increasingly more difficult to control the small amount of liquid that needs to be injected. Alternative methods must then be used.

A commonly used alternative is the bubbler. In a conventional bubbler, a carrier gas is bubbled through a heated precursor liquid to saturate the gas with vapor. The gas/vapor mixture then flows into the CVD or ALD chamber by opening and closing valves. Such prior art bubblers are shown and described in U.S. Pat. Nos. 5,288,325 and 6,579,372.

A prior art ALD deposition system is described by Hausmann et al. (Atomic Layer Deposition of Hafnium and Zirconium oxides using metal amide precursors), Chem. Meter. 14, 43-50-4358, 2002). An external volume is used to control the amount of vapor to be delivered to the deposition chamber. By opening and closing the on-off valves connected to the external volume, the external volume is first filled with vapor from a heated vaporization chamber and then emptied into the deposition chamber. Dielectric thin films such as metal oxides and nitrides including $SiO_2$, $HfO_2$, $Zro_2$, $WO_3$, and WN have been deposited by this method using ALD (Becker et al., *Diffusion barrier properties of tungsten nitride films grown by atomic layer deposition from bis(tertbutylimido) bid(dimethylamido)tungsten and ammonia, applied physics letters*, Vol. 82, No. 14, 7 Apr. 2003; Hausmann et al. *Surface morphology and crystallinity control in the atomic later deposition (ALD) of hafnium and zirconium oxide thin films*, Journal of Crystay Growth, 249, pgs. 251-261, 2003).

Figure 1:
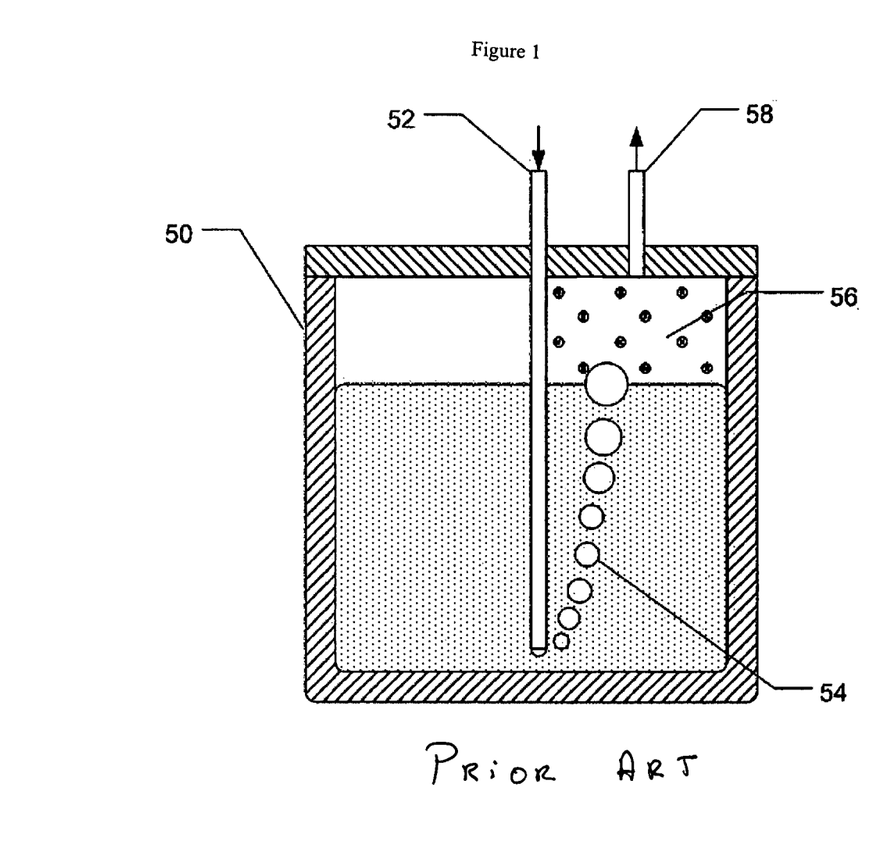
FIG. 1 is a schematic view of bubble and droplet formation in a conventional prior art bubbler.

FIG. 1 illustrates the bubble formation process in a conventional prior art bubbler. Liquid is placed in a metal container, 50, which is usually heated. A carrier gas is introduced into the bubbler through inlet tube 52. As the gas leaves the bottom of tube 52, it forms a stream of bubbles, 54. As each bubble rises through the liquid, the surrounding liquid pressure decreases, causing the bubble volume to expand causing the bubble to rise to the surface quickly. As the bubble bursts through the liquid surface, small droplets, 56, are formed, which are then carried by the gas/vapor mixture through the outlet tube 58.

One disadvantage of the prior art bubbler is that the precursor liquid must be placed in a heated vessel for a prolonged period. Prolonged thermal contact between the liquid and the hot vessel walls can cause the precursor liquid to thermally decompose to form undesirable by-products. Another disadvantage is that with increased gas flow, the gas bubbles would rise more quickly to the liquid surface thereby reducing the residence time of the bubbles in the liquid, thereby causing the gas to become less saturated with vapor. With the bubbler, the vapor generation rate is often unknown or uncontrolled. In addition, as the bubbles burst at the liquid surface, liquid is atomized to form droplets that are entrained by the carrier gas to deposit in the downstream components. Such components as valves, fittings, tubing connection, as well as the deposition chamber are often coated with precursor droplets that have impacted on the heated metal surface and subsequently under thermal decomposition to form a non-volatile residue coating the surface. Over time, the system components would become contaminated. The thin film deposition tool itself must then be shut down for maintenance and cleaning, resulting in the loss of productivity of the tool.

A porous metal wall with interstitial spaces extends from the liquid reservoir for containing liquid from the reservoir.

SUMMARY OF THE INVENTION

The present invention includes an apparatus for vaporizing a liquid for subsequent thin film deposition on a substrate. The apparatus comprises a housing with an inlet and an outlet and a liquid reservoir. A mechanism controls the liquid level in the reservoir to a substantially constant level. A gas flow passageway extends along side the porous metal wall for forming a gas/vapor mixture suitable for thin film deposition.

The present invention also includes an apparatus vaporizing a liquid into a carrier gas for thin film deposition in which a mechanism changes the temperature of the carrier gas as it flows into the vaporization chamber in which vapor is added to the carrier gas.

The present invention also includes a method for generating a gas/vapor mixture for use in thin film deposition in which liquid disposed within a porous metal body is vaporized, and adding the vapor to a carrier gas passing along side the porous metal body to form a gas/vapor mixture and providing such gas/vapor mixture for thin film deposition.

The present invention also includes an apparatus for vaporizing a liquid for subsequent thin film deposition in which a liquid reservoir within a housing contains the liquid. A mechanism controls the liquid level in the reservoir. A gas flow passageway extends into the reservoir allowing the gas to bubble through the liquid to form a gas/vapor mixture. Additionally, a porous metal filter is positioned at an outlet to filter the gas/vapor mixture.

The present invention also includes an apparatus for vaporizing a liquid for subsequent thin film deposition having at least two vaporizing chambers, each vaporizing chamber having a passage for carrier gas to flow therethrough and in which carrier gas forms a gas/vapor mixture. A thermoelectric module in thermo conductive contact with the vaporizing chambers controls the temperature of the chambers.

DETAILED DESCRIPTION OF THE INVENTION

This invention includes a new approach to liquid vaporization for gas saturation that would overcome the disadvantages of the prior art bubbler of FIG. 1. A small amount of liquid is placed in the vaporizer to minimize thermal decomposition. The new vaporization apparatus is also highly stable and repeatable and capable of generating high purity gas/vapor mixtures that are substantially free of particulate contaminants. The resulting high purity gas/vapor mixture is suitable for use in semiconductor and other industries for film deposition on a substrate for semiconductor device fabrication or other applications A vaporization apparatus described in this invention is generally indicated at 100 in FIG. 2. Like reference characters will be used to indicate like elements throughout the drawings. The vaporization apparatus 100 will also be referred to as a diffusion vaporizer. Although gas saturation occurs by vapor diffusion both in the present apparatus as well as the conventional bubbler of FIG. 1, the apparatus of FIG. 2 does not involve bubble formation in a liquid to provide the surface area needed for vapor diffusion into the carrier gas. Instead, a porous metal with a wetted liquid surface is provided to generate vapor for diffusion into the interior of a carrier gas stream flowing along the porous metal.

Figure 2:
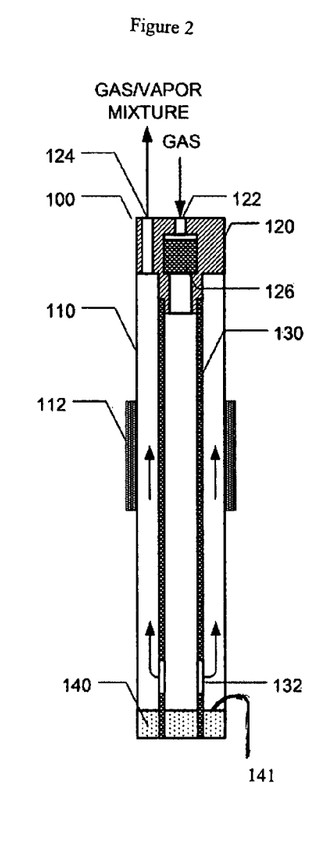
FIG. 2 is a schematic view of a diffusion vaporizer of the present invention.

The diffusion vaporizer 100 includes a tubular metal housing 110, which is connected to a metal piece 120 with an inlet 122 and an outlet 124 for the carrier gas to enter and the gas/vapor mixture to exit. A porous metal piece 126 is positioned inside the metal piece 120. A porous metal tube 130 is welded to the bottom of the metal piece 120. All these metal pieces (including the housing 110, metal piece 120, porous metal piece 126 and porous metal tube 130) are in close thermal contact with one another and are at substantially the same temperature.

An electric heater 112 is clamped around the housing 110 and is in close thermal contact with the housing. When electrical power is applied to the heater 112, the entire vaporization apparatus 100 including the tubular housing and all components inside become heated to substantially the same temperature. In some applications, when a volatile liquid is to be vaporized, it may be necessary to cool the vaporizer to a temperature below the ambient room temperature. In which case, a thermoelectric cooler (not shown) can be used in place of the electric heater 112 to cool the vaporizer to the desired lower temperature for liquid vaporization and gas saturation.

The tubular metal housing 110 contains liquid 140 to be vaporized. The liquid is in contact with porous metal tube 130 near the base of the apparatus 100. By virtue of capillary surface tension, the liquid is drawn automatically into the interstitial pore space of the porous metal that forms the wall of tube 130, rising above the free liquid surface 141, and filling the wall of the porous metal tube 130 with liquid. Even though the liquid is in contact only with a small part of the porous metal tube near its bottom, the entire porous metal tube, including the section above the liquid surface becomes saturated and wet with liquid. As a result, liquid vaporizes from the entire wetted porous metal surface to generate vapor for gas saturation and subsequent film deposition.

The carrier gas enters the diffusion vaporizer at near ambient temperature through inlet 122. The gas then flows through the interstitial pore space of porous metal piece 126, which is distinct and separate from the porous metal tube 130. Unlike porous metal tube 130, porous metal piece 126 is dry and not saturated with liquid. As the dry gas flows through the dry interstitial pore space of porous metal piece 126, the gas is quickly heated by the hot porous metal to substantially the same temperature as the porous metal. The heated gas stream flowing out of the porous metal piece 126 then flows downward within the interior space of the porous metal tube 130 for vapor saturation.

As the gas flows along the inside surface of porous metal tube 130, vapor generated at the porous metal tube surface diffuses into the interior of the flowing gas stream causing the gas to become partially saturated with vapor. Vapor diffusion will continue as the gas stream continues its journey downward inside the porous metal tube 130. As a result, the vapor concentration and partial pressure of the gas will increase.

Near the lower end of the porous metal tube 130, there are several vertical slots 132 cut into the wall of the porous metal tube 130. Upon reaching these slots, the gas flows through the slots into the surrounding annular space 143 between the tubular metal housing 110 and the porous metal tube 130 and begins to ascend through the annular space. As the gas flows in the upward direction through the annular space, vapor generated at the outside surface of the wetted porous metal tube 130 diffuses into the gas stream causing the concentration and the partial pressure of the vapor in the gas to continue to rise. Vapor diffusion into the gas will cease when the partial pressure of the vapor in the gas becomes equal to the saturation vapor pressure of the liquid at the temperature of the vaporizer. The gas then becomes saturated with vapor and exits the vaporizer through outlet 124 as a fully saturated gas stream.

In contrast to the conventional bubbler of FIG. 1, the diffusion vaporizer 100 described in this invention operates in a quiescent manner. There is no bubbling of gas through a liquid in order for the gas to become saturated with vapor. Vapor saturation occurs by virtue of vapor diffusion in a flowing gas stream in contact with a wetted porous metal surface with interstitial pore space filled and saturated with the precursor liquid. There is no bubbling of the liquid and no droplets are formed to cause the downstream components to become contaminated as in the conventional bubbler of FIG. 1.

For a specific vaporizer operating at a specific temperature, there is a certain maximum gas flow rate at which the gas will be fully saturated with vapor before its exit from the vaporizer. If the gas flow rate is below this maximum, the gas will be saturated with vapor. If the gas flow rate is higher than the maximum, the gas will be partially saturated and will emerge from the vaporizer as a partially saturated gas stream. The maximum gas flow rate for 100% vapor saturation depends on the vaporizer design, such as the diameter and the length of the porous metal tube 130, the insider diameter of metal housing 110, the operating temperature and pressure of the vaporizer, and the thermo-physical properties of the liquid and vapor as well as those of the gas.

Figure 3:
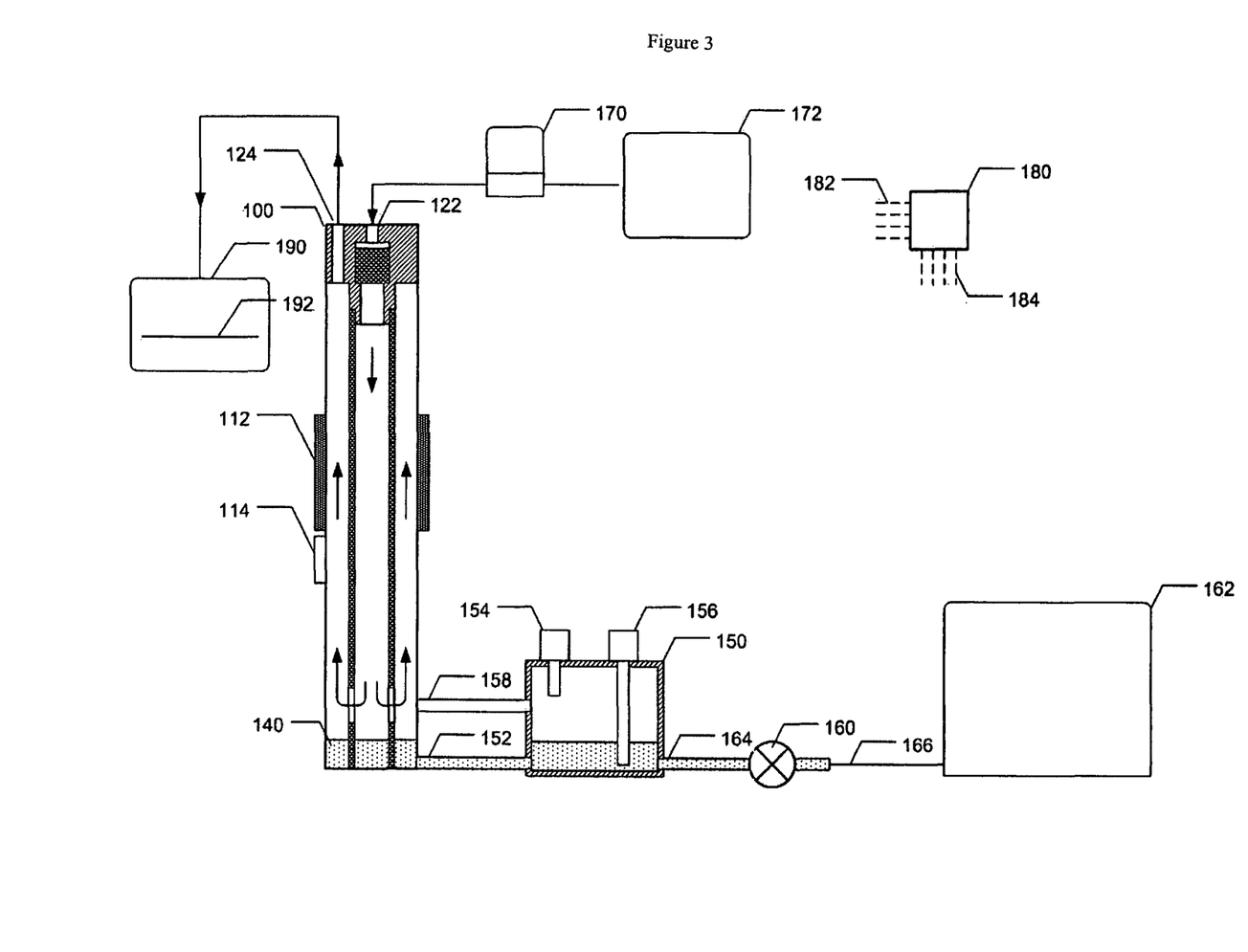
FIG. 3 is a schematic view of a system for vapor generation by diffusion and film formation.

Although only a small amount of liquid 140 is contained in the vaporizer, this liquid can be replenished in the manner shown in FIG. 3. An external reservoir 150 containing a larger volume of the liquid is connected to the vaporizer through tube 152. Connected to the reservoir 150 is an external liquid source 162 containing liquid under pressure. This external pressurized liquid source 162 is connected to reservoir 150 through tube 164 and solenoid valve 160. Mounted on the reservoir 150 are two level sensors, 154 and 156, with sensing surfaces placed inside reservoir 150. The valve 160 will open when the liquid level inside the reservoir 150 drops to the sensing level of the sensor 156. When the valve 160 is open, liquid will then flow from the external pressurized liquid source through the connecting tubing 166 and 164 to the reservoir 150. When the liquid level rises to the sensing level of sensor 154, the valve 160 will close. Since vaporizer 100 and the reservoir 150 are connected through the tube 152, the liquid level inside the vaporizer 100 will also rise and fall as the liquid level in the reservoir 150 rises and falls. By this means, the liquid level inside the vaporizer 100 is controlled by the two level sensors to within their respective sensing levels. To insure that the gas pressure inside the vaporizer and that inside the reservoir 150 are the same, a small capillary tube 158 is connected as shown to equalize the gas pressure between the vaporizer 100 and reservoir 150 to allow the liquid level in the vaporizer and in the sensor reservoir to be substantially the same.

To supply carrier gas at the desired flow rate into the vaporizer 100, a gas flow controller 170 is provided. The gas flow controller 170 receives pressurized gas from the pressurized gas source 172 and delivers the gas at the required flow rate to the vaporizer 100 through its inlet 122. To control the temperature of the vaporizer to a specific set point value, a temperature sensor 114 is placed in close thermal contact with the vaporizer 100. For automatic control of the vaporizer, an electronic controller 180 is provided. Controller 180 has a multitude of input signal lines, shown generally at 182 and a multitude of output lines shown generally at 184, to provide the required control signal to various parts of the system that need to be controlled. The signal from the temperature sensor, the level sensors, and flow sensor in the flow controller are all connected to the electronic controller via its input signal lines. The appropriate control signals are then applied to the heater, the solenoid valve 160 and the flow controller to allow the temperature, the liquid level and the carrier gas flow rate to be controlled to their respective set point values.

The carrier gas and the gas/vapor mixture formed by using the present invention is characterized by being substantially particle free. By particle free is meant that the gas is not an aerosol that contains particulate matter carried by the gas or suspended within the gas. Such particulate matter in the carrier gas may cause condensation or droplet formation of the vaporized liquid which would not be useful for thin film deposition. Small particles can also deposit on the substrate causing defects to form in the film, resulting in impure films or films of inferior quality that is undesirable for thin film deposition for semiconductor device fabrication.

The gas/vapor mixture generated by the apparatus and method described above can be introduced into the deposition chamber 190 containing the substrate 192 on which thin film is to be deposited as shown in FIG. 3. As the gas/vapor mixture enters the chamber, it encounters the substrate, which is held at a suitable temperature for film deposition. As a result, a thin film is deposited on the wafer. The gas/vapor mixture then exits the chamber to an external vacuum pump (also not shown).

Figure 4:
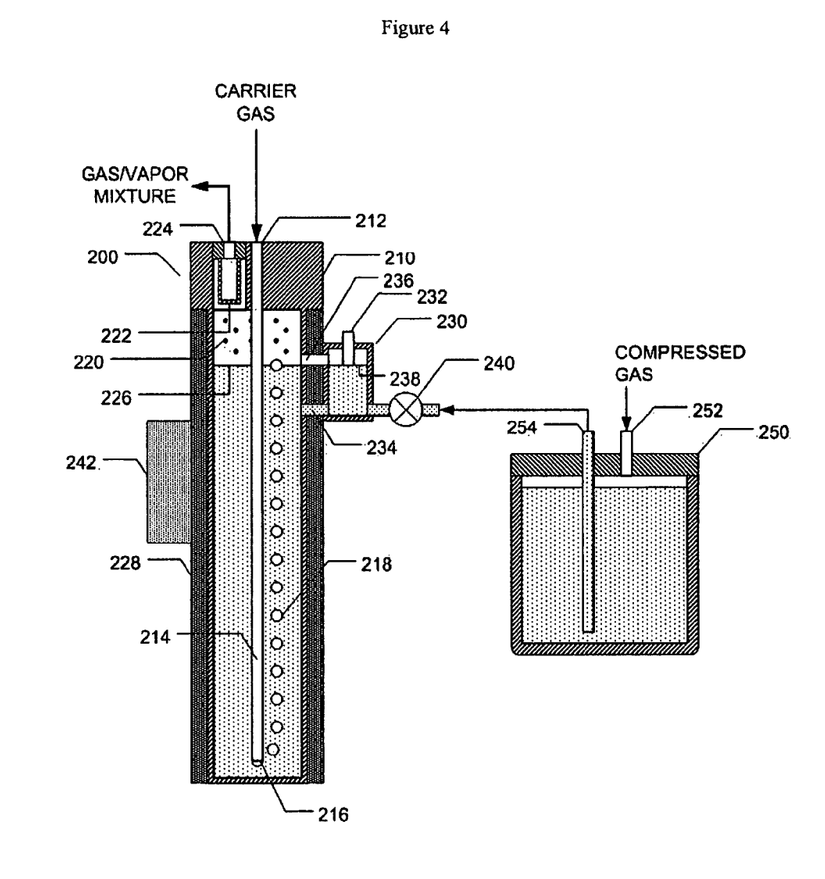
FIG. 4 is a schematic view of a bubbler with level control and external liquid source.

FIG. 4 shows a new improved bubbler. The bubbler, shown generally at 200, includes an inlet 212 for the carrier gas to enter the bubbler and an outlet 224 for the gas/vapor mixture to exit the bubbler. Upon entering the inlet through 212, the carrier gas flows down tube 214, then out of tube outlet 216 to form a stream of bubbles 218 in the surrounding liquid. The bubbles then rise through the liquid. Upon reaching the liquid surface 226, the bubbles burst to form droplets. Dissolved impurities in the liquid appear as residue particles 220, when the droplets vaporize in the carrier gas. These particles are suspended in the carrier gas/vapor mixture. When the mixture flows through the porous metal filter 222, the particles are removed, producing a pure gas/vapor mixture that is substantially free of particulate contaminants as it leaves the bubbler through exit 224.

To provide a constant degree of vapor saturation in the carrier gas, the liquid level in the bubbler 200 is controlled. A sensor reservoir 230 contains a level sensor 232 that detects the liquid level in the reservoir by contact or non-contact level sensing techniques. The sensor reservoir 230 is connected to the bubbler through tubes 234 and 236 to equalize the gas and liquid pressure in the bubbler with those in the sensor reservoir 230. The liquid level 238 in the sensor reservoir 230 is thus the same as the liquid level of liquid 226 in the bubbler. Alternatively, the sensor itself can be incorporated into the bubbler, thereby eliminating the need for a separate reservoir for level sensing. Upon detecting a liquid level below a desired set-point, the sensor provides an electrical output to actuate a valve 240 to allow liquid in an external liquid reservoir 250 to flow through the valve 240 and the tube 234 into the bubbler. When the liquid level reaches the desired set-point, the valve 240 is closed.

The external liquid reservoir 250 contains a supply of liquid sufficient to operate the bubbler for a period of time for example a day, a week or a month. The liquid in the supply reservoir is pressurized by compressed gas applied to inlet 252. The gas pressure is regulated by a pressure regulator (not shown) to a constant but adjustable value. The liquid in the reservoir 250 can thus be set to a specific constant pressure, the pressure being sufficient to cause the liquid to flow from the reservoir through the valve 240 and the tube 234 into the bubbler 200 when the valve 240 is open.

It is common practice in the semiconductor industry to use the liquid reservoir described in U.S. Pat. No. 5,288,325 or as illustrated in FIG. 1 as a bubbler. As the liquid is consumed due to vaporization, the level within the prior art bubbler falls. When the level has fallen to a low level, the reservoir (bubbler) must be removed from the system and refilled. Alternatively, a new reservoir (bubbler) containing a fresh supply of liquid can be used to replace the one that has been exhausted. Refilling and replacing the prior art bubbler requires the system to be shut down leading to the loss of production during the shut-down period. The bubbler and the liquid supply scheme shown in FIG. 4 allows the bubbler 200 to continue to operate for vapor saturation and semiconductor thin film deposition, while the external liquid supply reservoir 250 is being replenished or replaced.

In addition, since the liquid level in the bubbler 200 is controlled to a constant or near constant level, the degree of vapor saturation in the carrier gas is also precisely controlled, leading to improved rate of film formation and more uniform film thickness being produced by the film deposition process. In a conventional reservoir bubbler shown in FIG. 1, the liquid level continues to fall during operation, leading to variation in vapor saturation in the carrier gas, especially at high carrier gas flow rates, leading to variable film deposition rate, as well as non-uniform film thickness.

The present invention also includes a bubbler generally indicated at 200 in FIG. 4. The bubbler 200 is typically made of stainless steel. The bubbler is typically slender in shape and small approximately ⅓ the size of the reservoir bubbler shown in FIG. 1. The small size of bubbler 200 and its low mass would make the bubbler easier to heat or cool quickly to the desired operating temperature. The amount of electrical power needed for heating or cooling is also reduced when compared to the conventional reservoir bubbler. The small size, quick thermal response, and low power consumption leads to cost and size savings that can be considerable since the production system used for film deposition in which the bubbler 200 is used is usually placed in a clean room, which are quite expensive to build, when the system size is large.

To vaporize liquid of a low volatility, the bubbler 200 usually must be heated to a high enough temperature to generate sufficient vapor pressure for film deposition. An electrical band heater 228 is clamped tightly around the bubbler as shown in FIG. 4 to provide the desired heating power to the bubbler. A thermocouple temperature sensor is usually included to provide temperature feed back for bubbler temperature control. Both the temperature sensor and feed back controller are common industrial devices and are not shown in FIG. 4.

When the liquid to be vaporized is volatile, the bubbler may need to be controlled to a temperature that is near the ambient temperature of the room in which the bubbler 200 is located. In some cases, the bubbler 200 must be cooled to below room temperature. When heating and cooling are needed a thermoelectric module 242 can be used. The thermoelectric module is also referred to as a Peltier module. The thermoelectric module 242 provides both cooling and heating by simply reversing the polarity of the DC voltage applied to the module.

When heating and cooling are needed, a conductive metal piece is substituted for the heater 228. The conductive piece of metal is tightly clamped around the bubbler 200 to provide thermal conductive contact. The metal piece is usually made of aluminum because of the low density of the aluminum, its low thermal mass, and its high thermal conductivity. The metal piece is then thermally coupled to the thermoelectric module 242 as shown to provide the needed heating and/or cooling to control the bubbler 200 at near room temperature or below room temperature.

Figure 5:
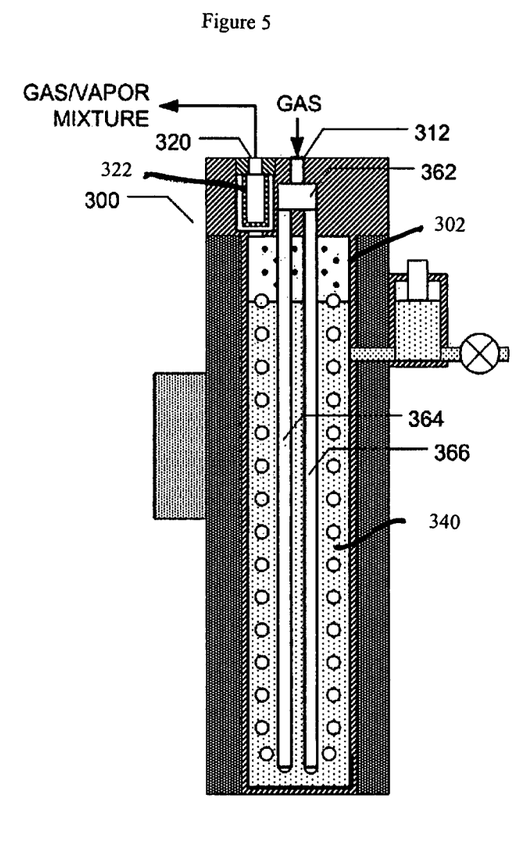
FIG. 5 is a schematic view of a high capacity bubbler.

FIG. 5 shows a vaporizer 300 having a single bubbler 302 using two small diameter metal tubes 364 and 366 for bubble generation and carrier gas saturation. The carrier gas, upon entering the inlet 312, flows to a small chamber 362 to which the two small diameter tubes 364 and 366 are attached. The gas then flows through both tubes and forms two streams of bubbles in the surrounding liquid 340. The gas/vapor mixture from both tubes then flows through the porous metal filter 322 and exits the vaporizer 300 through outlet 320. The overall capacity of the bubbler 302 for vapor saturation in a carrier gas can thus be doubled. In principle, as many tubes as needed can be used to increase the carrier gas flow capacity of the bubbler 302 to a high value. For simplicity, such a multi-tube bubbler having more than two tubes is not shown. Only two tubes are shown in the design of the bubbler 302 in FIG. 8.

The same approach described above to increase the capacity of the bubbler can also be used to increase the capacity of the Diffusion Vaporizer 100 shown in FIG. 2.

Figure 6:
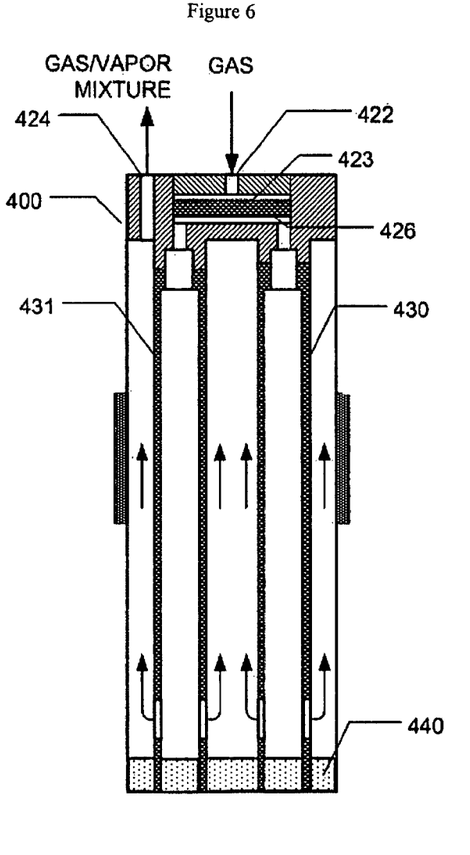
FIG. 6 is a schematic view of a high capacity diffusion vaporizer

FIG. 6 shows a Multi-Tube Diffusion Vaporizer 400 in which only two porous metal diffusion tubes 430 and 431 are shown for clarity. The carrier gas enters the Multi-Tube Diffusion Vaporizer 400 through inlet 422. The carrier gas enters chamber 423, which is provided with a porous metal piece 426. As the gas flows through the porous metal piece 426, it is heated to nearly the same temperature as the surrounding metal. The heated gas flow then enters the two porous-metal tubes 430 and 431. The porous metal tubes are partly immersed in liquid 440 near the bottom of the vaporizer 400 and the tubes 430, 437 are saturated with liquid in their interstitial pore spaces. As the carrier gas flows along the inside and outside surfaces of the porous metal tubes, the carrier gas becomes saturated with vapor by gas-phase vapor diffusion into the gas. The carrier gas then becomes saturated with the precursor vapor before exiting the Multi-Tube Diffusion Vaporizer through outlet 424. Even though only two porous metal diffusion tubes are shown, more than two tubes can be used to further increase the capacity of the diffusion vaporizer.

Figure 7:
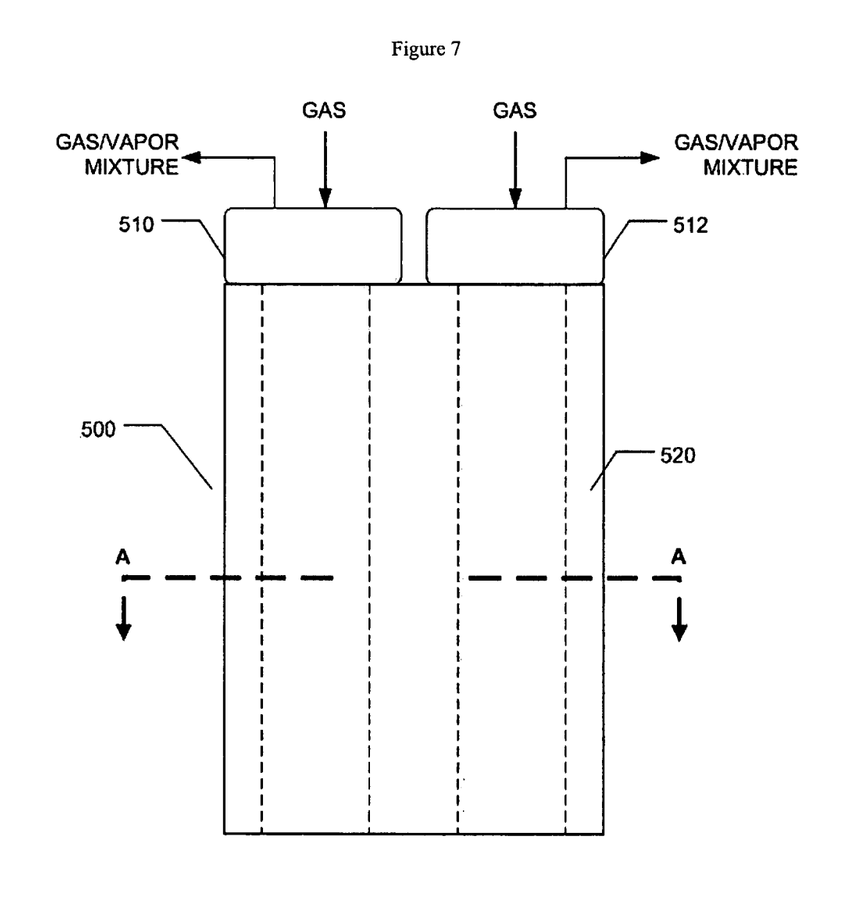
FIG. 7 is a schematic view of a multi-channel vaporizer in a metal block.
Figure 8:
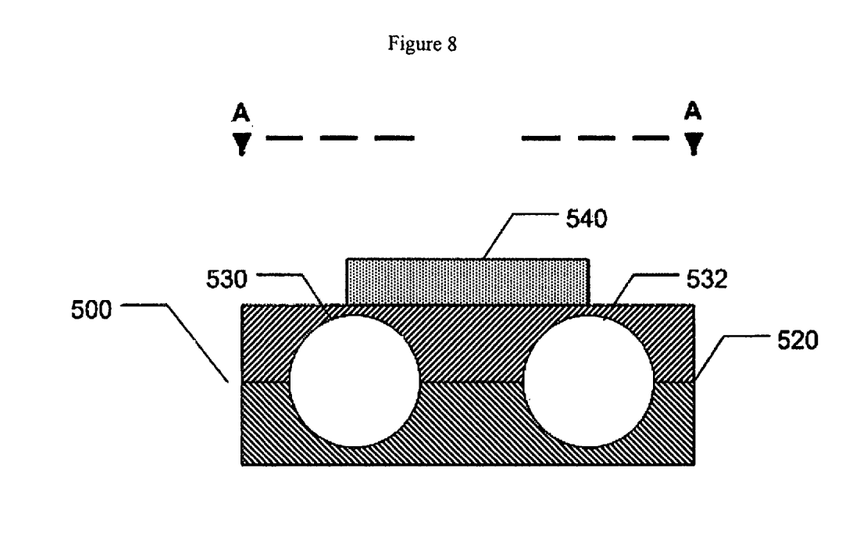
FIG. 8 is a schematic view of a sectional view of metal block for a multi-channel vaporizer of FIG. 7.

A dual-channel vaporizer is shown generally at 500 in FIG. 7. The dual-channel vaporizer 500 includes a metal block 520 in which two vaporizers 510 and 512 are positioned. The vaporizers can be either the porous metal diffusion type described with respect to FIGS. 2 and 3, or be the bubbler type in operating principle as described with reference to FIGS. 4 and 5. A sectional view A-A through the metal block 520 is shown in FIG. 8. The metal block is usually made of a light weight metal such as aluminum. There are two cylindrical cavities, 530 and 532, in the metal block. The block itself is split into two halves so that the metal can be tightly clamped around the cylindrical shaped vaporizers 510 and 512 to provide good thermal contact between the vaporizers 510 and 512 and metal block 520. A thermoelectric module 540, i.e. a Peltier module, in close thermal contact with the metal block 520 provides heating or cooling as may be needed to control the temperature of the metal block 520, hence that of the vaporizers 530 and 532, to a desired value. For temperatures near room temperature or below room temperature, the thermoelectric heating and cooling module 540 must be used in order to achieve precision temperature control. The designs illustrated in FIGS. 7 and 8 make it possible to use a single thermoelectric module 540 to provide precision temperature control for two separate independent vaporizers both operating at the same or substantially the same temperature.

If the vaporizer is to be controlled to a temperature that is sufficiently high compared to the ambient room temperature, a simple electric heater will suffice. The approach shown in this invention, as illustrated in FIGS. 7 and 8 can also be used for heating, in which case 540 will become a simple electric heater, rather than a thermoelectric heating and cooling module.

The above approach to using a single thermoelectric module, or heater, as the case may be, to control two separate vaporizers to the same temperature can also be used to control a multitude of vaporizers, i.e. more than just two vaporizers, to the same temperature. For instance, to control four vaporizers with the same thermoelectric module, it is necessary only to provide four cylindrical cavities in metal block 520 to accommodate the four cylindrical shaped vaporizers. Again, the vaporizers can be the diffusion type, the bubbler type, or a combination of both. The possibilities of such combinations will become clear to those who have read and understood this invention and will not be further described.

Although the present invention has been described with reference to preferred embodiments, workers skilled in the art will recognize that changes may be made in form and detail without departing from the spirit and scope of the invention.

The invention claimed is:

1. A method for generating a gas/vapor mixture for use in thin film deposition, the method comprising:
    vaporizing a liquid disposed within a tubular porous metal body, the porous metal body comprising a first surface defining a first carrier gas flow path and a second surface defining a second carrier gas flow path in a substantially opposite direction to the first carrier flow path and at least one slot disposed proximate a lower end of the first surface;
    adding vapor generated from the liquid to a carrier gas passing sequentially in direct contact along the first and second surfaces of the porous metal body to form a gas/vapor mixture the carrier gas first flowing generally downwardly along the first surface, through the at least one slot and then generally upwardly along the second surface of the porous metal body; and
    providing the gas/vapor mixture for thin film deposition.

2. The method of claim 1 further comprising introducing said gas/vapor mixture into a chamber for deposition on a substrate.

3. The method of claim 1 and further comprising changing a temperature of the carrier gas prior to adding the vapor to the carrier gas.

4. The method of claim 1 further comprising heating the porous metal body.

5. The method of claim 1 further comprising cooling the porous metal body.

6. The method of claim 1 wherein the liquid is disposed within the porous metal body by drawing the liquid into interstitial pores spaces of the porous metal body by capillary action from a volume of the liquid.

7. The method of claim 6 further comprising replenishing the volume of the liquid.

8. The method of claim 7 wherein replenishing the volume of the liquid comprises adding liquid to a reservoir that is in fluid communication with the volume of liquid.

9. The method of claim 6 further comprising controlling a level of the volume of the liquid at a set value.

10. The method of claim 1 wherein the carrier gas passes in direct contact along at least two sides of the porous metal body.

11. The method of claim 10 wherein the porous metal body has a tubular configuration and the at least two sides comprise an inside surface of the porous metal body and an outside surface of the porous metal body.

12. The method of claim 1 wherein the gas/vapor mixture is fully saturated.

13. The method of claim 1 wherein the carrier gas is pressurized.

14. The method of claim 1 further comprising controlling a temperature of the carrier gas at a selected value when the carrier gas is passing in contact along the porous body.

* * * * *

UNITED STATES PATENT AND TRADEMARK OFFICE
CERTIFICATE OF CORRECTION

Page 1 of 2

PATENT NO. : 8,603,580 B2
APPLICATION NO. : 11/605204
DATED : December 10, 2013
INVENTOR(S) : Benjamin Y. H. Liu

It is certified that error appears in the above-identified patent and that said Letters Patent is hereby corrected as shown below:

The title page should be deleted and substitute therefor the attached title page.

In the Claims, Column 10, lines 38-39, please insert the following:

-- 15. The method of claim 1 further comprising controlling a flow rate of the carrier gas at a selected value. --

Signed and Sealed this
Twenty-second Day of April, 2014

Michelle K. Lee
*Deputy Director of the United States Patent and Trademark Office*

CERTIFICATE OF CORRECTION (continued)

(12) United States Patent
Liu (10) Patent No.: US 8,603,580 B2
(45) Date of Patent: Dec. 10, 2013

(54) HIGH STABILITY AND HIGH CAPACITY PRECURSOR VAPOR GENERATION FOR THIN FILM DEPOSITION

(75) Inventor: Benjamin Y. H. Liu, North Oaks, MN (US)

(73) Assignee: MSP Corporation, Shoreview, MN (US)

( * ) Notice: Subject to any disclaimer, the term of this patent is extended or adjusted under 35 U.S.C. 154(b) by 974 days.

(21) Appl. No.: 11/605,204

(22) Filed: Nov. 28, 2006

(65) Prior Publication Data
US 2007/0120275 A1 May 31, 2007

Related U.S. Application Data

(60) Provisional application No. 60/740,029, filed on Nov. 28, 2005.

(51) Int. Cl.
C23C 16/00 (2006.01)
F22B 23/00 (2006.01)
B01D 47/00 (2006.01)

(52) U.S. Cl.
USPC .......... 427/248.1; 118/715; 118/726; 261/100

(58) Field of Classification Search
None
See application file for complete search history.

(56) References Cited

U.S. PATENT DOCUMENTS

| | | | |
|---|---|---|---|
| 4,441,027 A | 4/1984 | Richardson et al. | 261/119.1 |
| 4,704,988 A * | 11/1987 | Mellet | 118/726 |
| 5,078,922 A | 1/1992 | Collins et al. | 261/139 |
| 5,231,968 A | 8/1993 | Sietkes | 123/549 |
| 5,288,325 A | 2/1994 | Gomi | 118/692 |
| 5,400,665 A * | 3/1995 | Zhu et al. | 73/863.12 |
| 5,707,415 A * | 1/1998 | Cain | 65/379 |
| 5,711,816 A * | 1/1998 | Kirlin et al. | 118/726 |
| 6,579,372 B2 | 6/2003 | Park | 118/715 |
| 6,789,789 B2 * | 9/2004 | Randive et al. | 261/133 |
| 6,829,044 B2 | 12/2004 | Liu | 356/37 |
| 2001/0035127 A1 * | 11/2001 | Metzner et al. | 118/715 |
| 2002/0078894 A1 * | 6/2002 | Timmons et al. | 118/726 |
| 2003/0064154 A1 * | 4/2003 | Laxman et al. | 427/255.28 |
| 2005/0006799 A1 | 1/2005 | Gregg et al. | 250/577 |
| 2005/0066893 A1 * | 3/2005 | Soininen | 118/715 |
| 2006/0154480 A1 * | 7/2006 | Yamoto | 438/680 |

FOREIGN PATENT DOCUMENTS

WO WO2005/067017 * 7/2005

OTHER PUBLICATIONS

Dennis M. Hausmann, Esther Kim, Jill Becker, and Roy G. Gordon "Atomic Layer Deposition of Hafnium and Zirconium Oxides Using Metal Amide Precursors" Chem. Mater. 14: 4350-4358, 2002.

(Continued)

*Primary Examiner* — Joseph Miller, Jr.
(74) *Attorney, Agent, or Firm* — Westman, Champlin & Koehler, P.A.; Z. Peter Sawicki (57) ABSTRACT

A method for vaporizing a liquid for subsequent thin film deposition on a substrate. The method comprises vaporizing a liquid which is disposed within a tubular porous metal body. The porous metal body comprises a first surface defining a first carrier gas flow path and a second surface defining a second carrier gas flow path in a substantially opposite direct to the first carrier flow path. Vapor is generated from the liquid and added to a carrier gas that passes sequentially in direct contact along the first and second surfaces of the porous metal body to form a gas/vapor mixture with the carrier gas first flowing along the first surface and then along the second surface thereby providing a gas/vapor mixture for thin film deposition.

15 Claims, 8 Drawing Sheets